(12) United States Patent
Hurrell (10) Patent No.: US 7,038,609 B1
(45) Date of Patent: *May 2, 2006

(54) SUCCESSIVE APPROXIMATION ANALOG-TO-DIGITAL CONVERTER WITH PRE-LOADED SAR REGISTERS

(75) Inventor: Christopher Peter Hurrell, Cookham (GB)

(73) Assignee: Analog Devices, Inc., Norwood, MA (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/976,610

(22) Filed: Oct. 29, 2004

Related U.S. Application Data (63) Continuation-in-part of application No. 10/302,067, filed on Nov. 22, 2002, now Pat. No. 6,828,927.

(51) Int. Cl.
*H03M 1/12* (2006.01)
*H03M 1/38* (2006.01)

(52) U.S. Cl. .................. 341/156; 341/161; 341/172
(58) Field of Classification Search ............. 341/156, 341/159, 161, 165, 136, 118, 120, 163, 172; 330/9, 253

See application file for complete search history.

(56) References Cited

U.S. PATENT DOCUMENTS

| | | | | |
|---|---|---|---|---|
| 3,956,708 A * | 5/1976 | Musa | ........................ | 330/253 |
| 4,320,347 A * | 3/1982 | Haque | .......................... | 330/9 |
| 4,641,129 A | 2/1987 | Doluca et al. | .............. | 341/156 |
| 4,907,002 A * | 3/1990 | Kawada | ....................... | 341/172 |
| 4,940,981 A * | 7/1990 | Naylor et al. | ............... | 341/161 |
| 5,247,299 A * | 9/1993 | Lim et al. | .................... | 341/136 |
| 5,272,481 A * | 12/1993 | Sauer | ......................... | 341/165 |
| 5,416,484 A * | 5/1995 | Lofstrom | .................... | 341/159 |
| 5,633,639 A * | 5/1997 | Hopkins | ..................... | 341/161 |
| 6,424,276 B1 * | 7/2002 | Munoz et al. | ............. | 341/120 |
| 6,731,232 B1 * | 5/2004 | Kearney | ..................... | 341/163 |
| 6,828,927 B1 * | 12/2004 | Hurrell et al. | ............. | 341/156 |

* cited by examiner

*Primary Examiner*—Patrick Wamsley
(74) *Attorney, Agent, or Firm*—Wolf, Greenfield Sacks, P.C.

(57) ABSTRACT

A SAR converter having enhanced performance by virtue of effectively pre-loading the SAR's most significant bits with a value that makes the associated DAC output almost equal to the signal to be converted. A normal SAR conversion is then completed with the SAR bits that have not been pre-loaded. The value used to pre-load the most significant bits of the SAR is preferably obtained from a low-resolution, high-speed converter, such as a flash. The range of DAC bits used in the normal SAR part of the conversion may be increased such that errors up to a certain magnitude in the high-speed converter can be corrected. Reducing power consumption of a SAR system can be readily accomplished by reducing comparator supply voltage. For a SAR converter architecture using a CAPDAC array or CAPDAC (capacitor array DAC), fairly large variations in comparator input voltage can be expected under these circumstances. If the input voltage variation becomes too large, damage to the comparator input devices can occur, or inaccuracies may develop. In one embodiment of the invention, the most significant bits are provided by sampling the input signal through a flash ADC that does not suffer from the input voltage restriction described above.

45 Claims, 9 Drawing Sheets

SUCCESSIVE APPROXIMATION ANALOG-TO-DIGITAL CONVERTER WITH PRE-LOADED SAR REGISTERS

RELATED APPLICATIONS

This application is a continuation-in-part of U.S. patent application Ser. No. 10/302,067, filed on 22 Nov. 2002 is now a U.S. Pat. No. 6,828,927.

FIELD OF THE INVENTION

This invention relates generally to analog-to-digital conversion and in particular to successive approximation A-to-D converters, and is more particularly directed toward a successive approximation A-to-D converter in which the most significant bits of the SAR are pre-loaded with a value nearly equal to the desired result.

BACKGROUND OF THE INVENTION

Successive approximation ADC is the name commonly given to an analog-to-digital conversion process in which digital approximations of the input analog voltage are determined on the basis of a binary search. A digital value stored in an n-bit successive approximation register (SAR) is input to a digital-to-analog converter, and a decision is made as to whether the value in the SAR represents an analog voltage that is higher or lower than the input analog value.

The initial value of the SAR is conventionally set to one-half the number that can be represented in the n bits of the SAR. To be more precise, an n-bit register can contain a value of $2^n-1$, but for purposes of successive approximation, the initial value has the most significant bit set and the others cleared, which translates into a value of $2^n/2$. If this comparison reveals that the digital approximation is indeed lower than the input voltage, the bit that was initially set remains set, the bit of next greater significance is also set, and another trial commences. If on the other hand, the SAR value is greater than the input analog voltage, the bit that was set for that trial is cleared, the bit of next greater significance is set, and another trial commences. It can be appreciated from this example why a successive approximation approach bears such a similarity to a binary search procedure.

Each bit of the SAR is set or cleared based upon a trial, so the conversion process requires only "n" trials to reach completion. SAR-type algorithms achieve conversion in much less time than a ramp-up technique. A ramp-up type of conversion, for example, requires that the input register of the D/A converter "count-up" by increments of 1 until the analog value is reached. Since each increment of the input register requires a trial to determine whether the analog input level has been reached, many trials may have to be performed before a successful conversion is achieved. There are other types of conversion systems that are even faster than SAR ADC, such as pipeline, flash, and half-flash, but these techniques require much more power than the SAR approach, and are thus unsuitable in many applications.

The main difficulty in A/D conversion generally is settling time. The digital value that is written to the input register (the SAR register in a successive approximation system) produces an analog output at the D/A converter which must be allowed to settle completely before a comparison is performed in order to guarantee system accuracy.

As noted, a conventional SAR converter consists of only a DAC (digital-to-analog converter), a SAR register, control logic, and a single comparator. To generate an N-bit conversion result, each component of the converter is used (or updated) N times in a series of what are known as bit trials. Since only one comparator is used, the converter linearity is only limited by the accuracy of the DAC. The conversion time is dominated by the settling time of the DAC and any comparator preamp, which have to settle to system accuracy every bit trial. Since it is now possible to make very accurate DACs, SAR converters can be made to be extremely accurate. They also require very few analog components. However due to the serial way by which the result is derived, they are inherently slow.

Accordingly, a need arises for an ADC that occupies a relatively small amount of valuable integrated circuit real estate, has a high accuracy, and reaches a conversion result rapidly.

SUMMARY OF THE INVENTION

These needs and others are satisfied by the SAR ADC of the present invention. While successive approximation SARs are extremely efficient at moderate throughput rates of up to 1 MHz (megahertz), for example, the large number of clock cycles necessary to implement a single conversion makes it very difficult to implement significantly higher speed converters. Keeping in mind that a conventional SAR converter includes a DAC and an associated SAR register, a way to dramatically reduce the number of clock cycles required is to pre-load the SAR register's most significant bits with a value that makes the DAC output almost equal to the signal to be converted. A normal SAR conversion is then completed with the SAR bits that have not been pre-loaded.

The value used to pre-load the most significant bits of the SAR can be obtained from a low-resolution, high-speed converter, such as a flash. However, with a binary weighted SAR converter architecture, the accuracy of the high-speed converter must be at least the same as the required accuracy of the whole converter. But if the range of the DAC bits used in the normal SAR part of the conversion is increased, then errors up to a certain magnitude in the high-speed converter can be corrected. The range can be increased by adding what are sometimes known as redundant bits. These redundant bits are extra bits that would not strictly be required if no inaccuracy existed in the high-speed converter.

It may be desirable to operate an integrated circuit at reduced power consumption, particularly for battery-powered applications. Reducing power consumption of a SAR system can be readily accomplished by reducing comparator supply voltage. However, in systems of the prior art, reducing operating voltage also means reducing input signal range, and, because of thermal noise, reduction of input signal range reduces signal-to-noise performance of the converter system.

For a SAR converter architecture using a CAPDAC array or CAPDAC (capacitor array DAC), fairly large variations in comparator input voltage can be expected under these circumstances. If the input voltage variation becomes too large, damage to the comparator input devices can occur. Short of permanent damage, the action of parasitic diodes can cause system inaccuracies under this type of input voltage stress.

In one embodiment of the invention, the most significant bits are provided by sampling the input signal through a flash ADC that does not suffer from the input voltage restriction described above. This practice of not determining the MSBs through the SAR ADC reduces the magnitude of the voltage variation at the comparator inputs. In another embodiment of the invention, the most significant bits are provided by a second SAR converter. In either case, additional capacitors can be provided at comparator inputs to attenuate signal change at these comparator inputs.

In accordance with one aspect of the present invention, an improved successive approximation analog-to-digital converter that produces an output digital representation of an input signal to be converted, includes a successive approximation register driving a CAPDAC digital-to-analog converter, and a comparator, having first and second operating power supply voltages, to which comparator the output of the first digital-to-analog converter is applied. The improved successive approximation digital-to-analog converter is characterized in that a second digital-to-analog converter driven by an analog-to-digital converter determines at least the most significant bit of the second digital-to-analog converter, wherein the output of the second digital-to-analog converter is summed with the output of the first digital-to-analog converter prior to being applied to the comparator. The voltage range at the comparator inputs, between maximum and minimum values, is reduced when compared to the voltage range at the comparator inputs of a successive approximation analog-to-digital converter and wherein the comparator also determines the most significant bit. In a preferred embodiment the first digital-to-analog converter is a CAPDAC converter.

In one form of the invention, the reduction of the voltage range at the comparator inputs maintains the parasitic diodes coupled to the comparator inputs in an off state.

In another form of the invention, the reduction of the voltage range at the comparator inputs avoids stress to the comparator inputs or other devices coupled to the comparator inputs which could cause permanent damage to the devices.

In one form of the invention, switching of capacitors corresponding to bits determined by the analog-to-digital converter driving the second digital-to-analog converter and the next DAC bit being selected for testing is sequenced such that comparator input signal swing is minimized. This switching may occur at substantially the same time.

In another form of the invention, the analog-to-digital converter driving the second digital-to-analog converter comprises at least one switched sampling capacitor having a first terminal coupled to said analog-to-digital converter's input, and a second terminal coupled to a first terminal of a second capacitor, a second terminal of the second capacitor being coupled to a bias voltage so as to attenuate any signal change on the second terminal of the switched sampling capacitor.

In still another form of the invention, the second terminal of the switched sampling capacitor is switched to the input of the comparator used for performing the LSB bit trials in order to determine the MSB bit, such that there is no separate coarse conversion comparator. The second capacitor may be a parasitic capacitor.

Preferably, the analog-to-digital converter driving the second digital-to-analog converter performs a coarse conversion of the input signal to be converted and propagates the coarse conversion result to the second digital-to-analog converter prior to the successive approximation conversion.

In one form of the invention, the analog-to-digital converter driving the second digital-to-analog converter may incorporate, at least in part, a parallel analog-to-digital converter. The parallel analog-to-digital converter may comprise, at least in part, a flash converter or a pipeline converter, for example. A comparator may be considered as a one-bit flash converter, and would be perfectly satisfactory in situations where only the MSB of the second DAC is being determined.

In another form of the invention, the first digital-to-analog converter has an associated full-scale range derived by subtracting negative full-scale value from positive full-scale value, and the full-scale range is constrained to be greater than a value derived by subtracting the weight of an LSB of the first digital-to-analog converter from the weight of an LSB of the second digital-to-analog converter.

In still another form of the invention, the first digital-to-analog converter has a full-scale range at least equal to a value derived by subtracting the weight of an LSB of the first digital-to-analog converter from the weight of an LSB of the second digital-to-analog converter, and adding the magnitudes of the analog-to-digital converter's most positive code transition error plus the magnitude of the analog-to-digital converter's most negative code transition error, such that potential errors introduced by analog-to-digital converter code transition errors are eliminated from the output digital representation. Of course, either of the analog-to-digital converter's most positive or most negative code transition errors may be zero.

Preferably, negative code transition errors are effectively eliminated by shifting all code transitions in a positive direction by an amount at least equal to the magnitude of the largest negative code transition error. Negative code transition errors may be effectively eliminated by shifting comparator thresholds, for example, or by offsetting the analog input to the analog-to-digital converter in the negative direction by an amount at least equal to the magnitude of the largest negative code transition error.

In yet a further form of the invention, the analog-to-digital converter may be implemented, at least in part, using switch capacitor techniques, where the offset is achieved by means of at least one additional capacitor and at least one additional device that functions as a switch. In still another form, the digital output from the analog-to-digital converter may first be shifted by adding a fixed offset before being applied to the first digital-to-analog converter.

In still a further form of the invention, the full-scale range of the first digital-to-analog converter is extended by at least an amount equal to the sum of the magnitudes of the positive and negative code transition errors of the analog-to-digital converter driving the second digital-to-analog converter. Preferably, the full-scale range of the first digital-to-analog converter is extended in the direction of the negative full-scale value by application of one or more fixed offsets. One or more fixed offsets is applied prior to completion of a successive approximation conversion, regardless of comparator output.

It is preferred that the total value of the fixed offset (or offsets) be at least as negative as the analog-to-digital converter's most negative code transition error. The fixed offset or offsets may be provided by a third digital-to-analog converter.

The first digital-to-analog converter may be binary weighted or non-binary weighted. In either case, it is preferred that the MSB of the first digital-to-analog converter have a weight that is at least equal to the weight of the LSB of the second digital-to-analog converter.

In one form of the invention, the output digital representation is derived from the digital input to the first digital-to-analog converter and the digital input to the second digital-to-analog converter, by providing the digital inputs to the first and second digital-to-analog converters, and providing a digital representation of the total value of all fixed offsets, as three inputs to recombination logic that provides the output digital representation. Preferably, the recombination logic operates on the three inputs to provide the output digital representation that corresponds to the sum of the predetermined bit weights in the first and second digital-to-analog converters, plus the total weight of the fixed offset (or offsets).

In accordance with another aspect of the present invention, a successive approximation analog-to-digital converter that produces an output digital representation of an input signal to be converted comprises a successive approximation register driving a CAPDAC digital-to-analog converter, a comparator, having first and second operating power supply voltages, to which comparator the output of the first digital-to-analog converter is applied, and a second digital-to-analog converter driven by an analog-to-digital converter that performs a coarse conversion of the input signal to be converted, and propagates the coarse conversion result to the second digital-to-analog converter prior to the successive approximation conversion. The comparator input voltage is reduced to a range no larger than the difference between the first and second operating power supply voltages. The output of the second digital-to-analog converter is summed with the output of the first digital-to-analog converter prior to being applied to the comparator.

Further objects, features, and advantages of the present invention will become apparent from the following description and drawings.

DETAILED DESCRIPTION OF THE INVENTION

Figure 1:
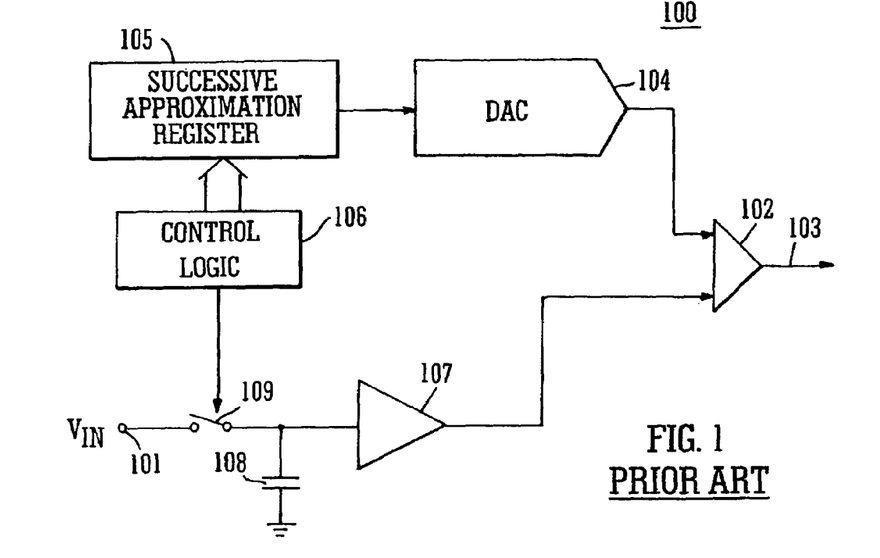
FIG. 1 illustrates a successive approximation analog-to-digital converter of the prior art.

There is described herein a SAR ADC with pre-loaded SAR registers that offers distinct advantages when compared to the prior art. A conventional successive approximation analog-to-digital converter of the prior art is illustrated in FIG. 1 and generally depicted by the numeral 100. A successive approximation register 105, which is "n" bits wide, and loaded by control logic 106, is coupled to the input register of an n-bit digital-to-analog converter (DAC) 104. The DAC output, in turn, is coupled to one of the inputs of a comparator 102. The analog input voltage to be measured, $V_{IN}$ 101, is coupled through a switch 109 to a sample and hold amplifier 107. A switch 109 is interposed between the analog input signal 101 and the input of the amplifier 107. A track/hold control signal from the control logic 106 controls the state of the switch 109.

When the switch 109 is ON, the input signal 101 is allowed to reach the input of the amplifier 107, with a capacitor 108 to ground. In this mode, the capacitor 108 is allowed to charge to the level of the input signal 101. Thus, this configuration represents the TRACK mode of operation of the circuit.

When the switch 109 is OFF, on the other hand, the input signal path to the amplifier 107 is interrupted, and the voltage on the holding capacitor 108 is applied to the amplifier. This condition corresponds to the HOLD mode of operation. The logic state of the output 103 of the comparator 102 indicates the relative amplitude of the DAC output voltage with respect to the input analog voltage.

A conventional SAR A/D 100 "finds" the value of the analog input signal 101 using a technique that is very similar to a binary search. Initially, the comparison value provided to the SAR 105 has only the most significant bit set and the remaining bits cleared. The analog input voltage 101 is either less than or greater than the comparison value derived from the SAR contents, in this initial case half of the voltage range. For each subsequent trial, less significant bits in the SAR are set and the comparison trials are repeated, but the "windows" of comparison always correspond to the voltage range between zero volts and the comparison level (a binary weighted fraction of the full scale voltage), and between the comparison level and the full scale voltage.

One of the disadvantages of the binary weighted voltage search algorithm associated with conventional successive approximation techniques is that, if an error happened to occur on a given trial, there is no provision for error correction. In other words, a bit set or cleared in error in the SAR always remains set or cleared, and that error persists through to the end of the conversion.

Figure 2:
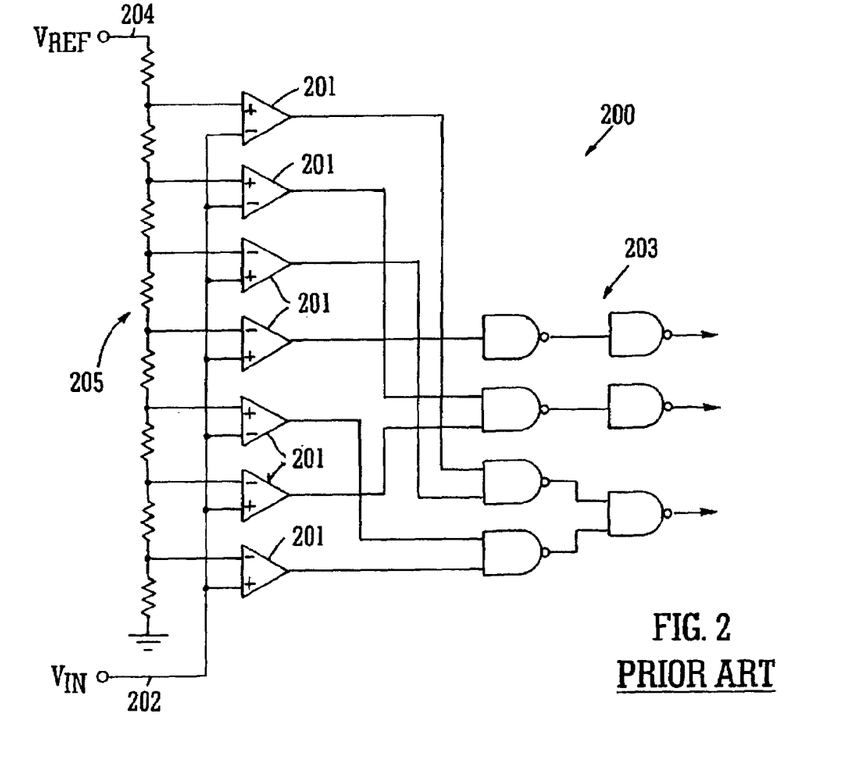
FIG. 2 depicts a type of parallel converter known in the art.

FIG. 2 depicts a type of parallel converter commonly known as a "flash" converter, in this example having a Gray code output, and generally depicted by the numeral 200. As is well-known, in a Gray code system only one output bit changes state at any one time. This has the advantage of minimizing any noise spikes that might propagate through the system due to multiple output stage switching.

The flash converter 200 includes $2^n-1$ comparators 201, biased 1 LSB apart, starting with +½ LSB. Each comparator 201 has a unique threshold voltage that is established through a resistor-string voltage divider 205 supplied by a reference voltage $V_{REF}$ 204. For an input voltage $V_{IN}$ 202 of zero volts, all comparators are OFF. As the input voltage 202 increases, an increasing number of comparators 201 will change state. The comparator outputs are then coupled to logic gates 203 at the converter output, in order to generate the desired output coding (Gray code in the example). Of course, binary outputs, or another desired coding scheme, could be easily implemented.

The principal advantage of the flash converter is speed. The speed of the system is directly attributable to the fact that conversion occurs in parallel, and is limited only by the speed of the comparators and output logic. This type of parallel conversion is the fastest conversion approach. Of course, the parallel conversion is a mixed blessing. If higher resolution is desired, the number of elements required increases rapidly, until a point is reached where the converter uses more power and occupies more real estate than a particular design can tolerate.

As discussed above, SAR converters tend to be slow due to the serial fashion in which conversion results are derived. Flash converters, as noted, represent the opposite extreme in terms of converter architectures. An N-bit flash converter consists of $2^N-1$ comparators which, in order to generate a conversion result, are all operated simultaneously. The accuracy of the converter is determined by the accuracy of the individual comparator thresholds. Since the speed of the comparator is much faster than the settling time of the DAC, and because all comparators are operated simultaneously, flash converters are much faster than SAR converters. However, they are expensive (in terms of analog components) and, because it is difficult to make high accuracy comparators, they tend not to be very accurate.

The large number of comparators required to make a flash converter, as well as their accuracy limitations, tend to restrict their use to low- to medium-resolution applications. However, since a comparator cell can be quite compact, up to about 6-bit resolution converters can be made in what, for many applications, is an acceptable die area.

Figure 3:
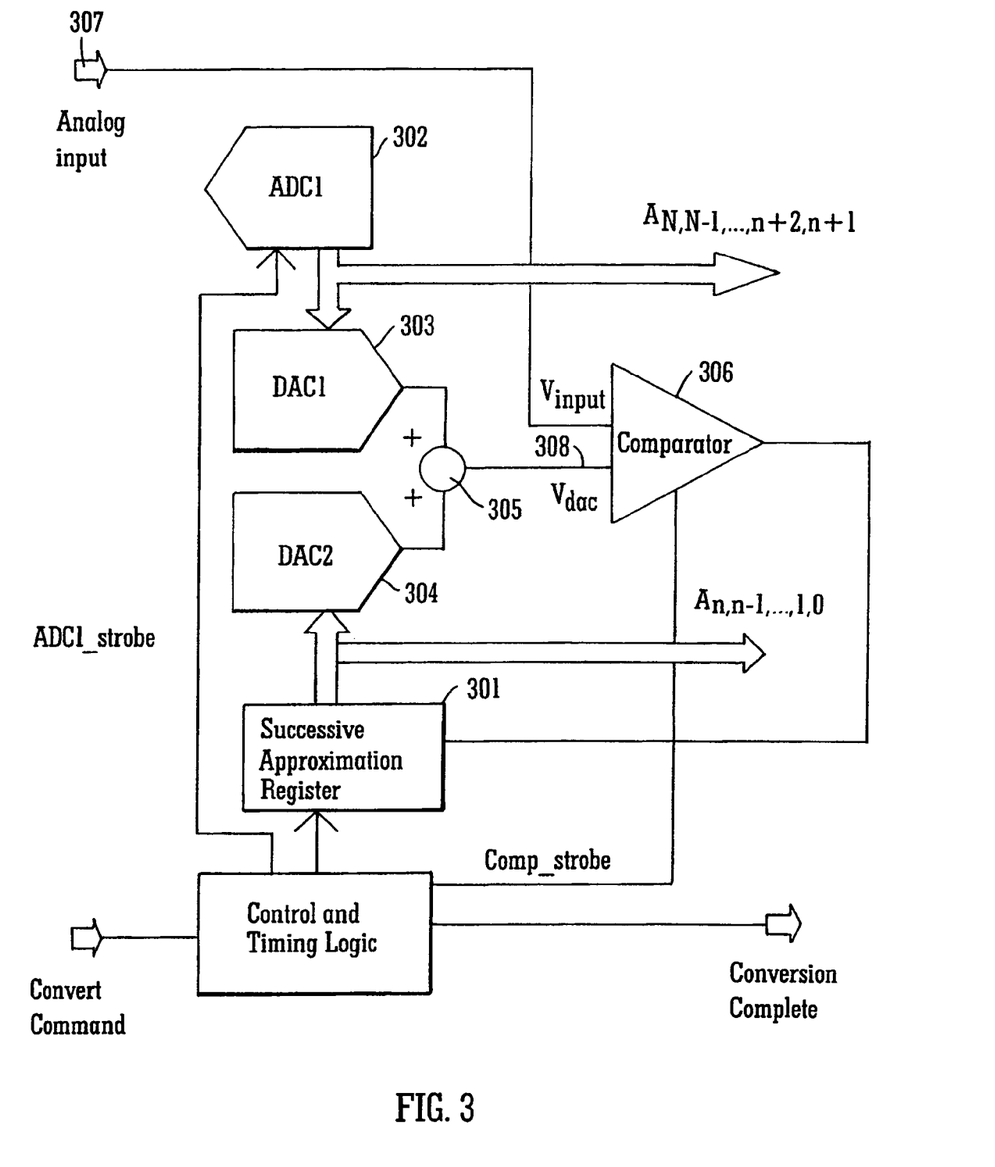
FIG. 3 illustrates an ADC architecture in which a SAR and a high-speed converter are combined.

FIG. 3 illustrates an ADC architecture in which a SAR converter 301, 304, 306 and a high-speed converter (ADC1) 302 are combined. The flash converter 302 generates the high order bits, which control DAC1 303, and the SAR converter, comprising the SAR register 301 and DAC2 304, generates the low order bits. DAC1 303 and DAC2 304 are combined in a summer 305 at the input to a comparator 306. DAC1 303 can be thought of as the most significant bits of the SAR converter, which, instead of being controlled by the SAR register, are in this new architecture controlled by the flash converter.

As an example, consider a 12-bit converter in which 6 bits are generated by the parallel converter ADC1 302, and 6 bits are generated by the SAR converter 301, 304. Since the conversion time is dominated by the speed of the SAR converter 301, 304, the overall conversion time is almost half that of a conventional 12-bit SAR converter. This architecture has one significant drawback. The accuracy of the conversion is limited by the accuracy of ADC1 302. If the accuracy of ADC1 302 is only $\pm\frac{1}{2}$ LSB$_{ADC1}$, then the accuracy of the final conversion result will be only $\pm32$ LSB. This, of course, is unacceptable.

The positive and negative full-scale values for the SAR converter 301, 304, 306 of FIG. 3 are $2^n-1$ and 0. For the SAR converter to be able to correct for the errors in ADC1 302, the positive full-scale of the SAR must be increased to a value $=(2^n-1+E_{pos})$, and the negative full-scale must be decreased to a value $=E_{neg}$, where $E_{pos}$ is ADC1's most positive code transition error, and $E_{neg}$ is ADC1's most negative code transition error.

Figure 4:
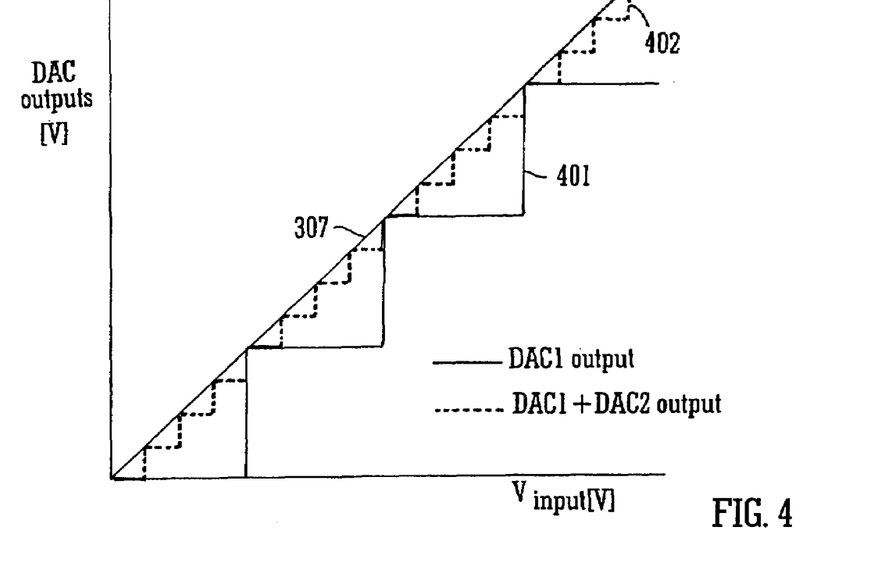
FIG. 4 shows the ideal characteristics for the 4-bit converter of FIG. 3, where there are no errors in the flash converter.

In order to appreciate more fully why the additional range is required, one must look at the output voltages from DAC1 and DAC2, at the end of the conversion, as a function of the input voltage 307 to the comparator 306. FIG. 4 shows the ideal characteristics for a 4-bit converter where there are no errors in the flash converter. Both the flash and SAR converters are 2-bit in this example. Stair-step waveform 401 (bold solid line) represents the output of the flash converter DAC1 303, while waveform 402 (dashed line) represents the combined outputs of DAC1 and DAC2 at the output 308 of the summer 305.

It should be noted that $V_{dac}-V_{input}$ is always in the range from 0 to $-1$ LSB. The reason why this value is never greater than 0 is that, while the SAR part of the converter is active, whenever a set bit results in $V_{dac}-V_{input}$ being greater than zero, that bit is then rejected. It is important that the difference value at the comparator input is always in the range 0 to $-1$ LSB, as any value outside this range corresponds to a conversion error. This is because there is a direct relationship between the digital value at the input to the DAC (which is the conversion result at the end of the conversion) and the DAC outputs.

Figure 5:
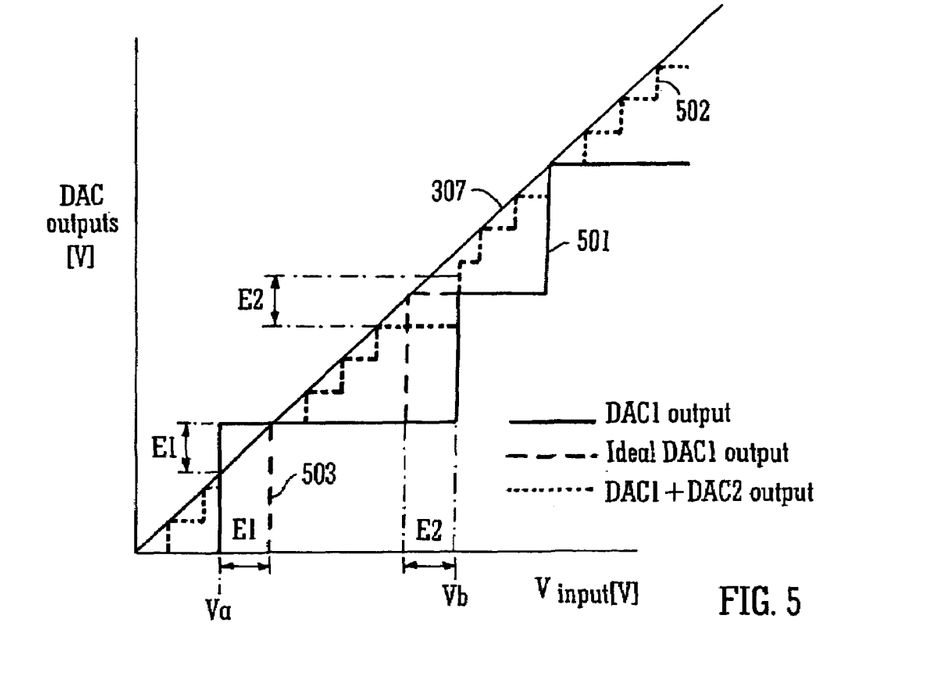
FIG. 5 illustrates the characteristic for the converter of FIG. 3 where ADC1 converter errors occur.

FIG. 5 illustrates the same characteristic for a converter where the ADC1 converter's $1^{st}$ and $2^{nd}$ transitions are in error by $-E1$ and $+E2$ respectively. The DAC1 output is represented by waveform 501 (bold solid line), while the combined DAC1+DAC2 output corresponds to waveform 502 (dashed line). The ideal DAC1 output is represented by dashed line 503. For voltages just above an input voltage $V_a$; $V_{dac}-V_{input}=E1$. To bring $V_{dac}-V_{input}$ to within the required range of 0 to $-1$ LSB, DAC2 would need to be able to generate a value of $-E1$.

Similarly, for an input voltage just below $V_b$, $V_{dac}-V_{input}=-1$ LSB$-E2$. To bring $V_{dac}-V_{input}$ to within the range from 0 to $-1$ LSB, DAC2 would need to be able to generate an additional voltage above DAC2's normal full scale value of $+E2$.

Figure 6:
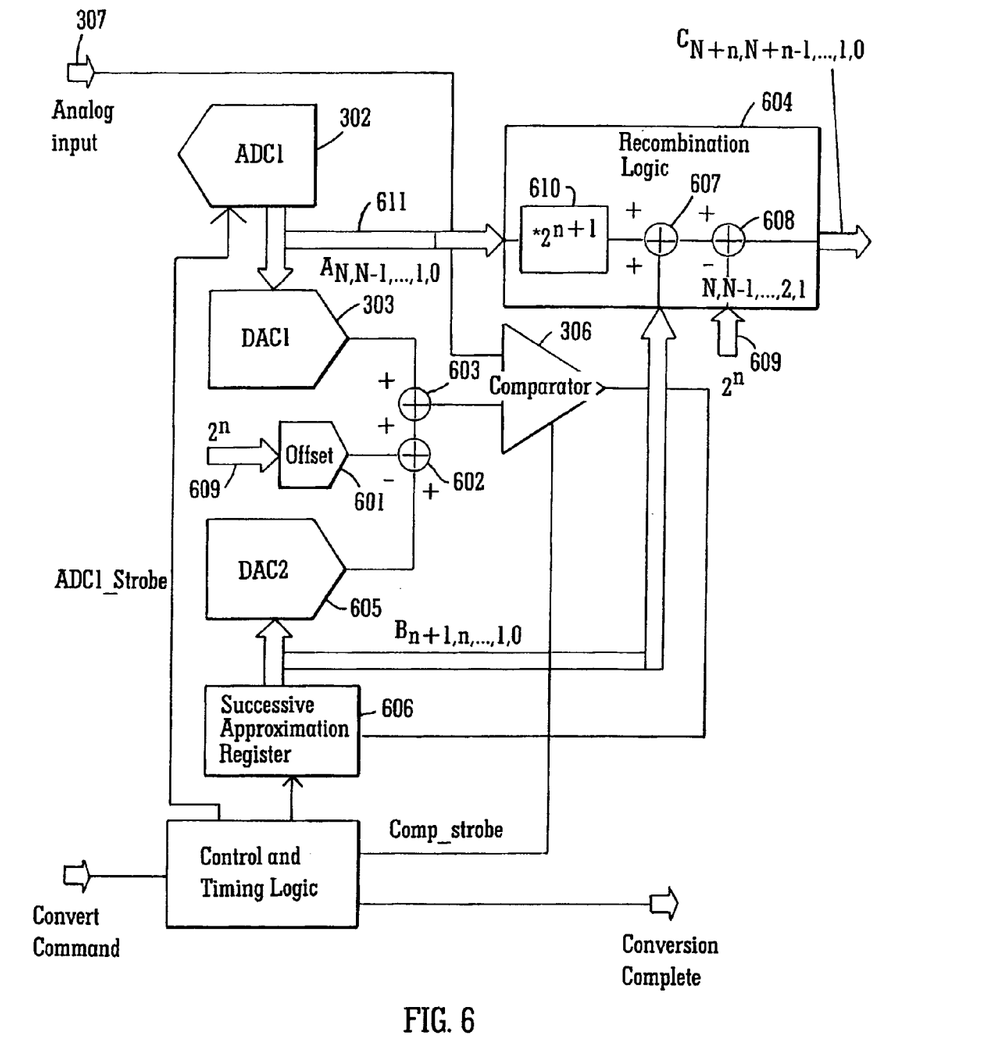
FIG. 6 depicts an ADC system in accordance with the present invention.

FIG. 6 depicts an ADC system in accordance with the present invention where the positive and negative full scales of the SAR converter 605, 606 have been extended to allow correction of errors in ADC1 302. The negative full scale of the SAR has been reduced to $-2^n$ by the inclusion of the fixed offset DAC 601 and the positive full scale value has been increased to $(2^n-1+2^n)$ by the addition of a higher order bit $B_{n+1}$ in DAC2 605.

The output of the fixed offset DAC 601 is combined with the output of DAC2 605 in a first summer 602. This combined result is then added to the output of DAC1 303 in second summer 603. The additional range provided through the inclusion of the fixed offset and the additional bit in DAC2 304 allows $E_{pos}$ and $E_{neg}$ to be as large as $+2^n$ and $-2^n$ respectively, but still to be corrected during the SAR part of the cycle. Since the ranges of the 2 DACs now overlap, an additional digital block 604, including recombination logic, is required to combine the digital inputs of the DACs and to account for the offset introduced by the fixed offset DAC 601.

The digital block 604 requires only adders 607, 608 to perform the combination of the 2 DAC inputs and the offset value 609. Using modern processes, these digital logic circuits can be made to occupy a die area significantly smaller than that necessary for analog circuits. The apparent multiplication 610 by $2^{n+1}$ is achieved simply by shifting bus A 611 so that the LSB of bus A is applied to adder input $2^{n+1}$. Modifications to the logic are possible in which the digital recombination is only done at the end of the conversion, or, alternatively, some of the recombination can be performed during the conversion. Also, the order of addition of the three digital values may be changed.

It should be noted here that the fixed offset (or offsets) that extends the negative full-scale of DAC2 (605 in FIG. 6) in the negative direction has to be at least as negative as the analog-to-digital converter's 302 most negative code transition error to avoid any consequent conversion error. However, if the result, generated by the analog-to-digital converter 302 has only positive code transition errors, then no negative fixed offset or offsets are required. This can be arranged in a number of ways:

First, the ADC 302, as so far described, would typically be expected to have both positive and negative code transition errors. By shifting all the code transitions up by an amount at least equal to the magnitude of the largest negative code transition error, the negative code transition errors would be eliminated. For a flash converter, the shifting of the code transitions can be achieved by simply shifting the comparator thresholds.

As a second possibility, the analog input 307 to the ADC could be offset in the negative direction by an amount at least equal to the magnitude of the largest negative code transition error. Switch capacitor techniques allow this to be achieved by means of additional capacitor(s) and switch(es).

In yet another alternative, digital logic can be inserted between the unmodified ADC's 302 output and DAC1's 303 input. The digital logic would generate a digital value that is shifted down by an amount at least equal to the magnitude of the largest negative code transition error.

Each of the above techniques also has the effect of increasing the positive code transition error of the overall ADC. However, eliminating the negative fixed offsets may result in a simplification of the overall architecture.

Figure 7:
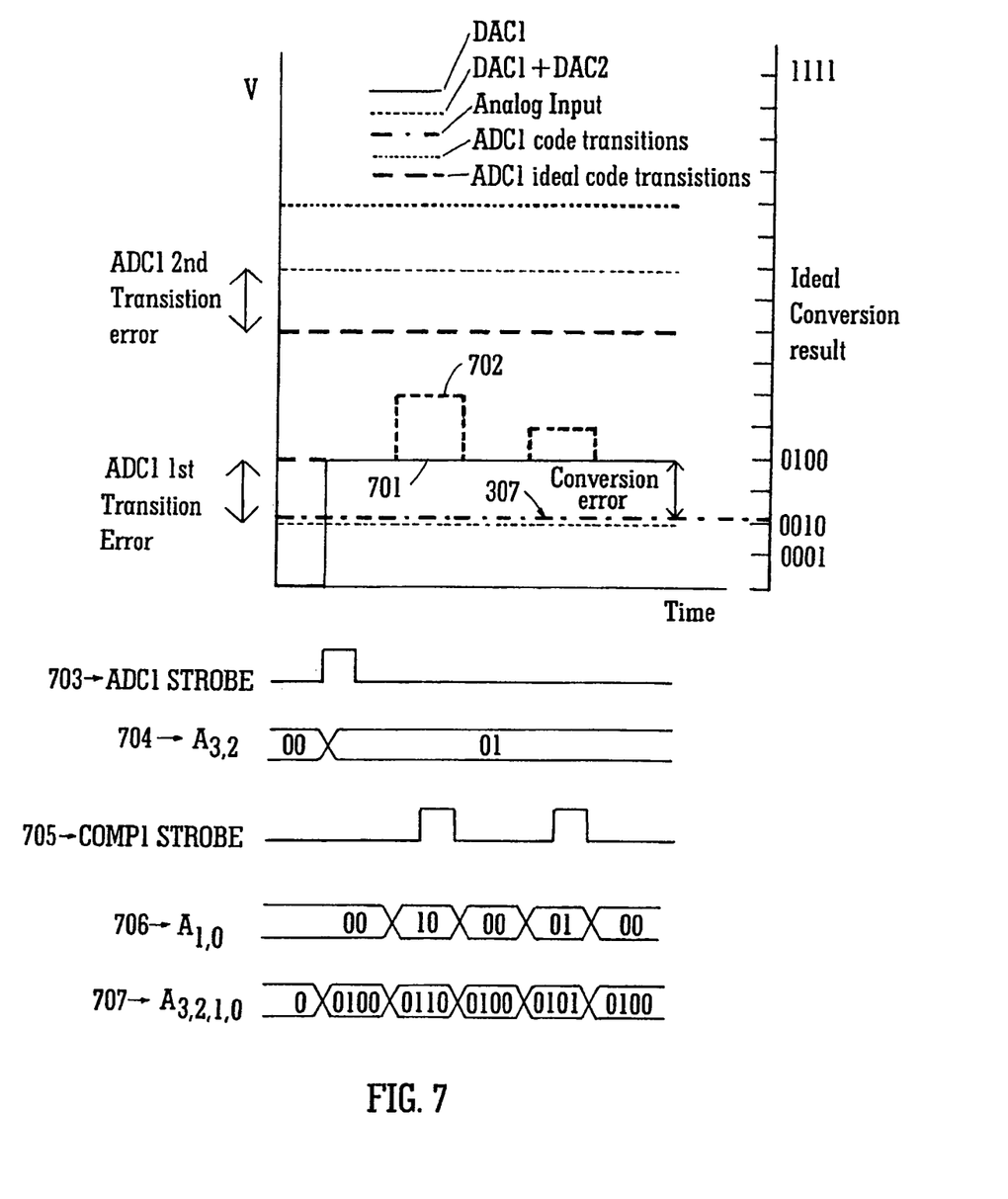
FIG. 7 is a timing diagram for the converter of FIG. 3.

FIG. 7 is a timing diagram for the converter of FIG. 3, where both DAC1 303 and DAC2 304 are 2-bit converters (N=3 and n=1). The analog input voltage is represented by waveform 307 (alternating long and short dashes), while the DAC1 output voltage is shown in waveform 701 (bold solid line). The dashed-line waveform 702 represents the combined DAC1 and DAC2 outputs.

On the rising edge of ADC1 STROBE 703, ADC1 (302 in FIG. 6) converts the analog input and the result appears on DAC1 input $A_{3,2}$ 704. Bit $A_1$ is then set in the SAR register (as shown in waveform 706), and, once the DAC has settled to sufficient accuracy, the comparator is strobed by control line COMP1 STROBE 705. Since the combined DAC output is larger than the analog input 307, bit $A_1$ is reset. Bit $A_0$ is then set and the comparator is once again strobed, resulting in bit $A_0$ also being reset. It should be emphasized that the combined DAC output should be less than the analog input at the end of the conversion. Of course, during the bit trials, the combined DAC output may be larger than the analog input, but when this happens the trial bit is then rejected.

FIG. 7 shows that ADC1's first and second code transitions are in error by −2 and +2 LSB, and $V_{input}$ is just above ADC1's first transition. The first transition error results in ADC1 incorrectly generating an output 01 (rather than 00). Despite both bits of the SAR converter being subsequently rejected, the error cannot be recovered and the resulting conversion is in error by +2 LSB. The error is 2 LSB because $V_{dac}-V_{input}$ is 2 LSB, while it should be in the range 0 to −1 LSB. It should be noted from an inspection of bits $A_{3,2,1,0}$ (waveform 707) that the final result in FIG. 7 is 0100, while it should actually be 0010.

Figure 8:
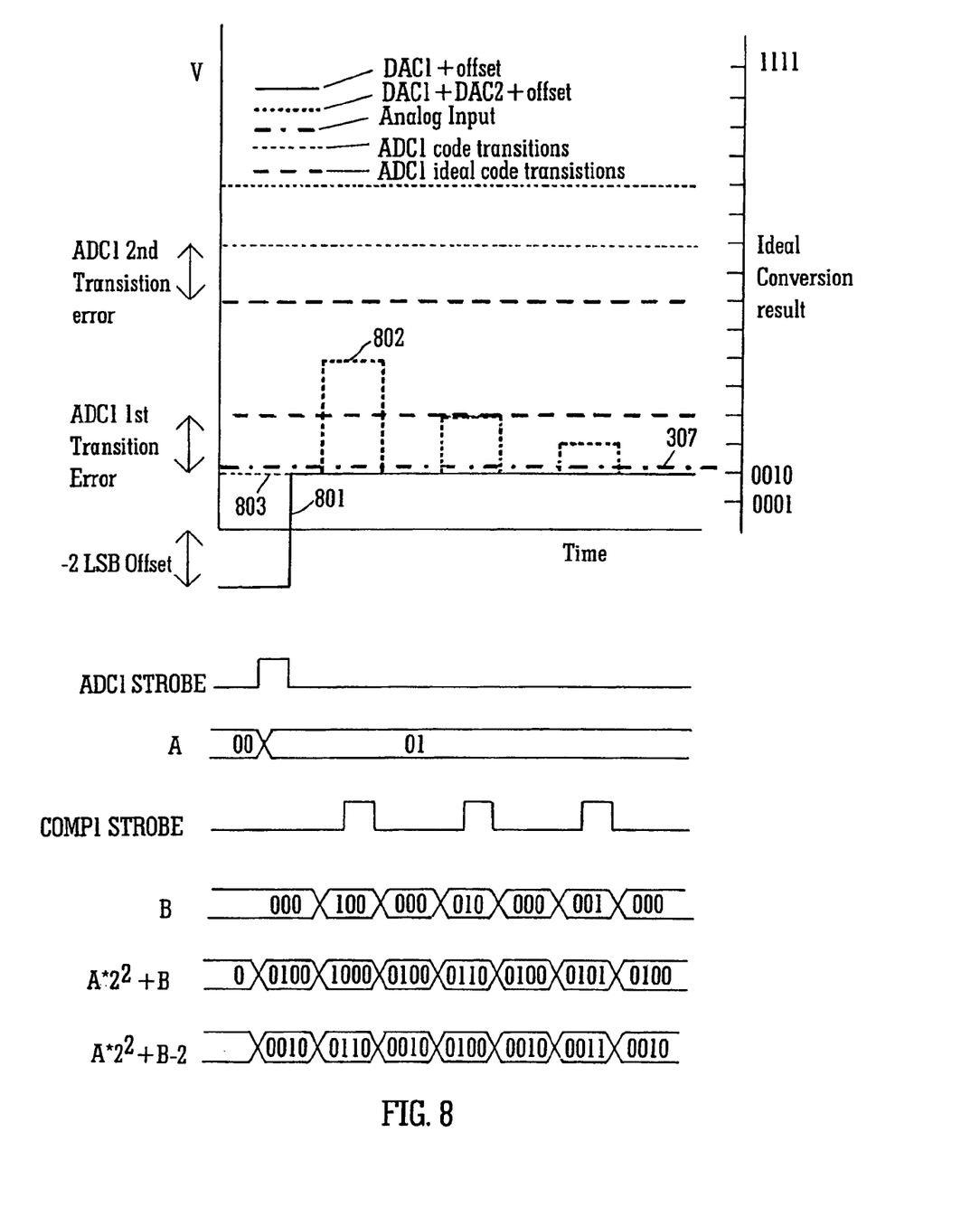
FIG. 8 is a timing diagram for the converter of FIG. 6.

FIG. 8 is a timing diagram for the converter of FIG. 6, where DAC1 303 is 2-bit and DAC2 605 is 3-bit (N=1 and n=1). Waveform 307 (alternating long and short dashes) is once again the analog input voltage. Waveform 801 (bold solid line) represents the output of DAC1 combined with the offset, while waveform 802 (short dashes) is the combination of DAC1, DAC2, and the offset voltage. ADC1's transition errors are the same as in FIG. 7. Also, just as in FIG. 7, $V_{input}$ 307 is just above ADC1's first transition, represented by a dotted line 803.

Figure 9:
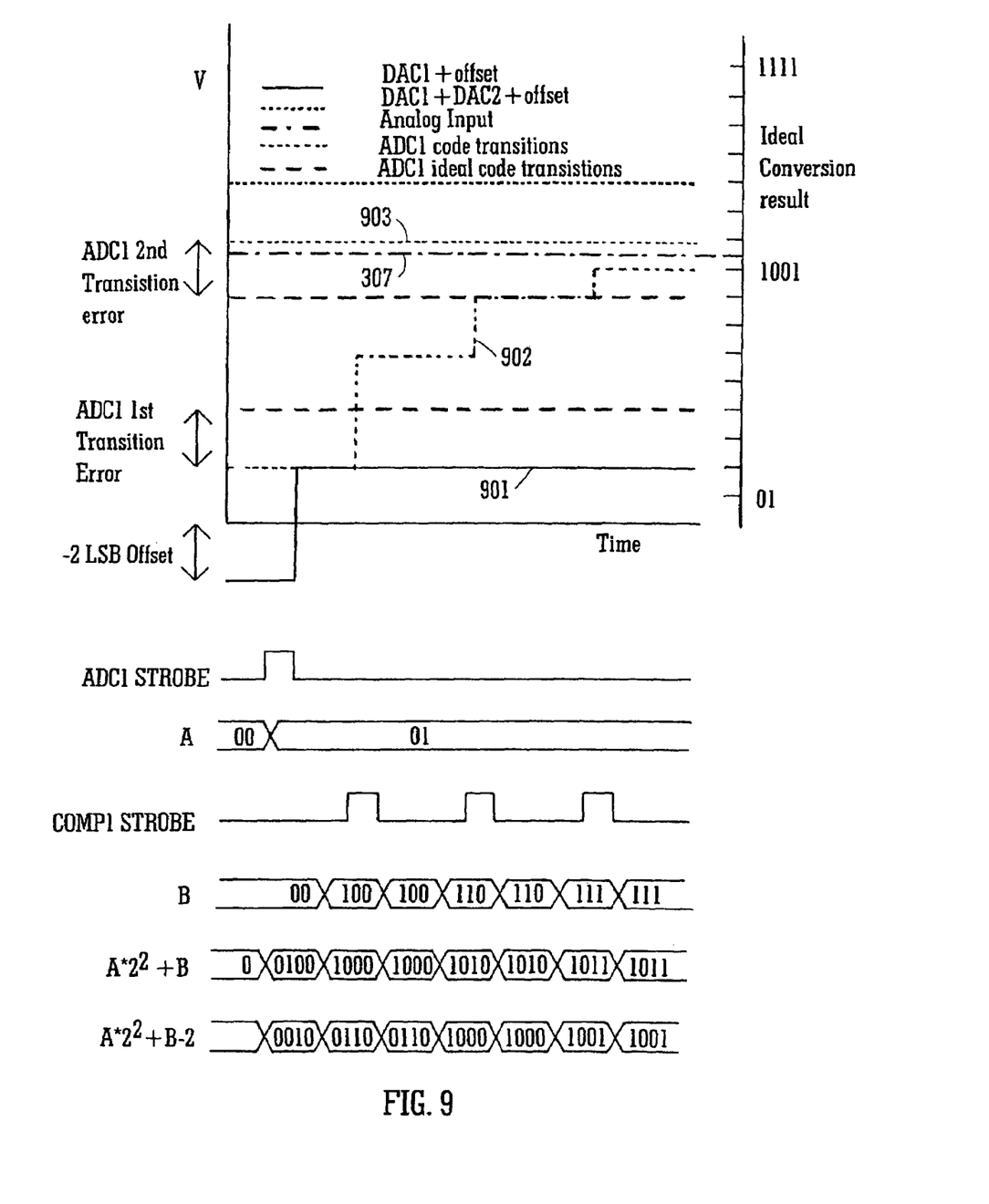
FIG. 9 is an additional illustrative timing diagram for the converter of FIG. 6.

As shown, by rejecting all 3 bits in the SAR, ADC1's error can be recovered and a correct conversion results. FIG. 9 illustrates the timing of the converter of FIG. 6 where $V_{input}$ 307 (alternating long and short dashes) is just less than the second transition error represented by dotted line 903. In the example of FIG. 9, all bits in the SAR converter are kept and again a correct conversion results. The waveform 307 is the analog input voltage in FIG. 9, as noted, while waveform 901 (the bold solid line) corresponds to the DAC1 output plus the offset voltage, and waveform 902 (short dashed line) is the combined DAC1 and DAC2 outputs with the offset also applied.

There has been described herein a SAR ADC with preloaded SAR registers that offers distinct advantages when compared with the prior art. It will be apparent to those skilled in the art that modifications may be made without departing from the spirit and scope of the invention. For example, the SAR DAC described in conjunction with the present invention need not be binary weighted. Although binary weighted DACs are still the most common form of DAC used within SAR converters, non-binary weighted DACs are beginning to become more popular, particularly for high-speed SAR converters.

The reason for this is that non-binary weighted DACs are more error tolerant: whereas non-binary weighted DACs cannot recover from any bit being incorrectly kept or rejected, non-binary weighted DACs have a certain tolerance to such errors. For example, if a bit with a weight of 4 LSBs in a binary weighted DAC is wrongly rejected (due to insufficient settling time in the DAC, for instance), the DAC output at the end of the conversion may end up being as much as 5 LSBs less than the analog input. This difference should be in the range 0 to 1 LSB. By adding an additional "redundant" bit, also with a weight of 4 LSBs, even if the first bit is incorrectly reset to zero, then as long as the second 4-LSB bit is correctly kept, the error is completely recovered.

Since the DAC is no longer binary weighted, additional recombination logic is required to generate a true binary result. However, since the use of extra redundant bits allows lower performance analog circuits to be used, this trade-off in some cases is well worthwhile. In practice, to allow correction of both wrongly kept and rejected bits, one or more negative fixed offsets have to be switched in during the conversion. These offsets must be accounted for in the recombination logic.

The additional redundant bit(s) also have the effect of increasing the full-scale range of the DAC. Some or all of this additional range may be allocated to correction of bit decision errors in the successive approximation converter itself. To avoid overall conversion errors, the full-scale range of the SAR converter DAC must be sufficient to allow correction of both code transition errors in the ADC and bit trial errors in the SAR converter itself.

It is also possible to implement digital-to-analog converters in a number of ways, specifically including switch capacitor techniques. It is even possible to construct a capacitor array that functions as both the sampling capacitor and the DAC. Such a system is described in detail in U.S. Pat. No. 4,129,863, issued Dec. 12, 1978 to Paul R. Gray et al., and fully incorporated by reference thereto as though fully set forth herein.

The power consumption of the comparator used in a SAR converter can be reduced by decreasing its power supply voltage. However, in prior art implementations of SAR converters, this has necessitated a reduction in the input signal range. Due to thermal noise, this reduction in input signal range results in an unwanted reduction in the signal-to-noise performance of the converter.

Figures 10, 11:
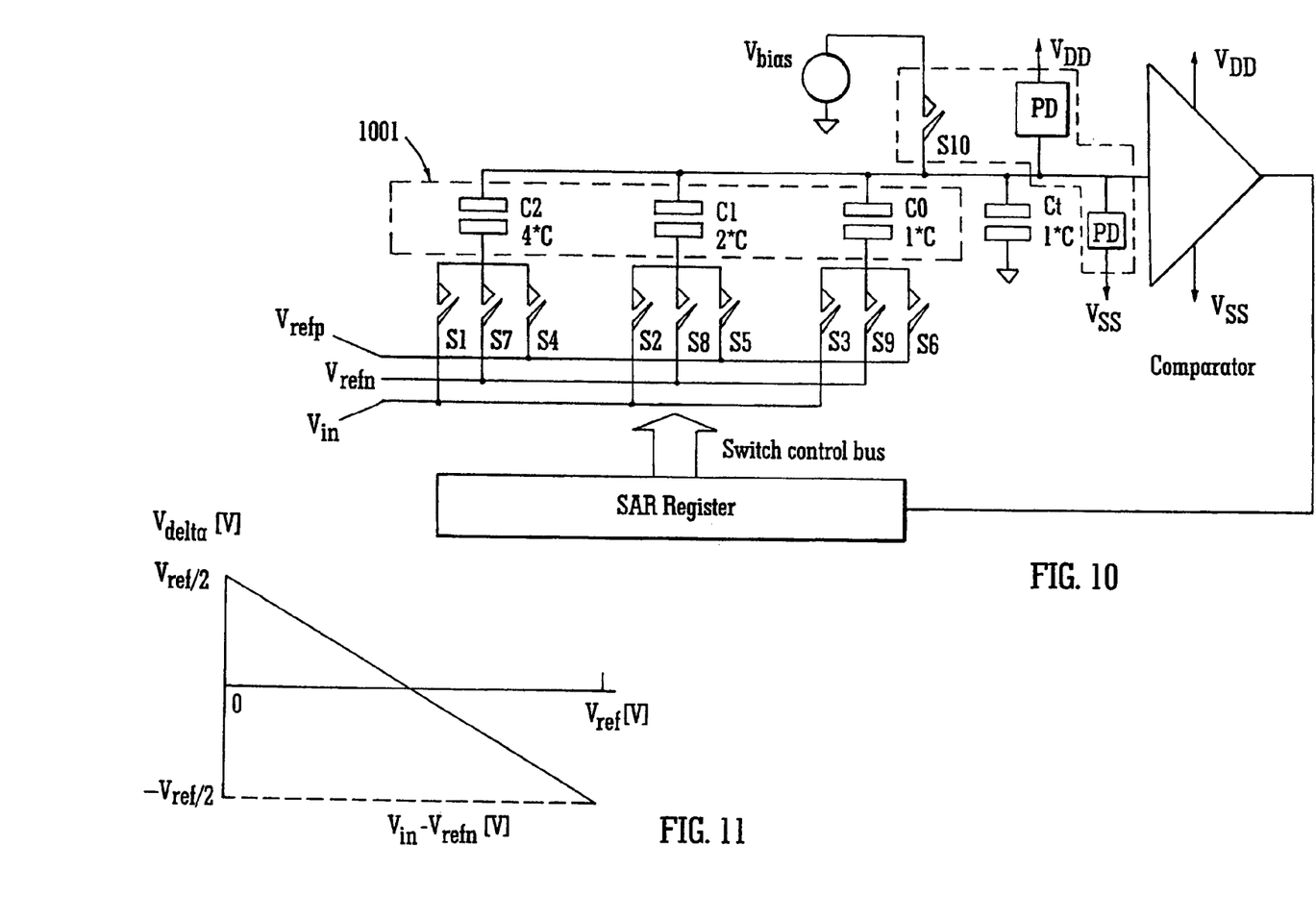
FIG. 10 is simplified diagram of a 3-bit single-ended converter.
FIG. 11 is a graph of the change in $V_{delta}$ as a function of input Voltage for an ADC of the prior art.

The reason for this required reduction in signal amplitude can be explained by considering the simplified diagram of a 3-bit single-ended converter illustrated in FIG. 10. During track mode, the left hand side (LHS) of the cap array 1001 is switched to the input signal by switches S1, S2, and S3 and the right hand side (RHS) of the cap array 1001 is switched to some fixed bias voltage $V_{bias}$ by switch S10. All other switches are open.

To sample the input signal onto the capacitor array 1001, switches S1, S2, S3, and S10 are opened. To perform the first bit trial decision, MSB capacitor C2 is switched to $V_{refp}$ by turning on switch S4, and switches S8 and S9 switch capacitors C1 and C0 to $V_{refn}$. The difference in comparator input voltage from its $V_{bias}$ value may be termed $V_{delta}$, and is given by the following relationship:

$$V_{delta} = V_{ref}/2 - Vin + Vrefn \quad (1)$$

Where $V_{ref} = V_{refp} - V_{refn}$. For a conventional prior art ADC, the peak magnitude of $V_{delta}$ occurs at the point in the conversion when the MSB is being tested. FIG. 11 is a graph of this change as a function of input Voltage. The maximum change occurs at positive and negative full scale and has a magnitude of $V_{ref}/2$.

If the magnitude of $V_{delta}$ is large enough to result in the comparator input voltage being either larger than the positive comparator supply voltage VDD, or less than the negative comparator supply voltage VSS, then not only can the comparator input devices start to become stressed, but also parasitic diodes (PD) in the RHS switch S110 may start to turn on, causing an error in the sampled input charge on the capacitor array 1001.

To allow the maximum change in voltage at the comparator inputs, without the comparator input voltage going outside the supply rails, $V_{bias}$ is often chosen to be at mid-supply (halfway between VSS and VDD). In this event, the maximum input span $V_{input\_span}$ for the ADC, to ensure that the comparator input voltage does not stray beyond the comparator supply voltage rails is given by the following:

$$V_{input\_span} = VDD - VSS \quad (2)$$

This simple expression can be derived from equation (1) above simply by making $V_{delta}$ equal to +(VDD−VSS)/2 and −(VDD−VSS)/2 to determine the maximum and minimum possible values for Vin.

In conjunction with the present invention, it is desirable to reduce this limitation on maximum input voltage span, as described above, by performing at least the first bit decision using an additional low resolution ADC that does not in itself suffer from this input span restriction. Such a combined converter is illustrated in FIG. 6 and has been described in detail previously. ADC1 302 performs the low resolution conversion of the input signal while the SAR converter, comprising comparator 306, SAR 606 and DAC 605, completes the conversion. While in this ADC, the input signal is applied to a separate input to the comparator 306 from the input that the DAC is connected to, it is understood that in a switched capacitor implementation of such an ADC, it is common for the DAC capacitor arrays to also act as the sampling capacitor. Such an implementation has been described in detail in U.S. Pat. No. 4,129,863.

Figures 12, 13:
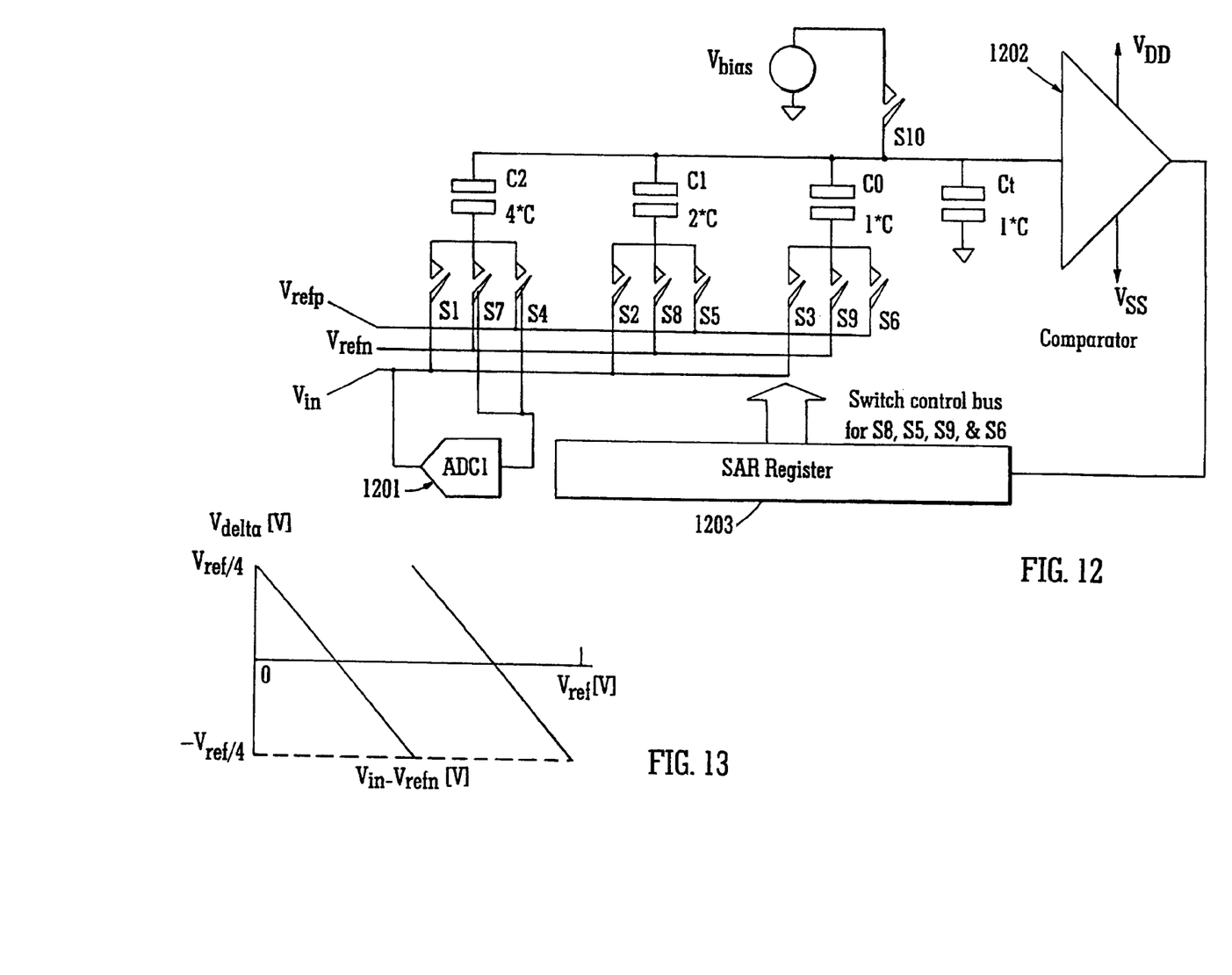
FIG. 12 illustrates, in simplified block diagram form, how an additional ADC allows an increased input signal level.
FIG. 13 is a graph of the change in $V_{delta}$ as a function of input Voltage for the ADC of FIG. 12.

To aid understanding of how such an additional ADC can allow an increased input signal level, an example of such a converter is illustrated in FIG. 12. In this example, the first bit is determined by ADC1 1201, which controls the MSB bit. The remaining 2 bits are determined by the SAR converter, made up of the comparator 1202 and SAR register (along with associated control logic) 1203. The sampling operation is identical to the conventional converter as already described. However, rather than using the comparator 1202 to determine the MSB bit, this bit is determined by ADC1 1201. The MSB cap C2 is then set accordingly by turning on switch S4 or S7, and C1 is switched to $V_{refp}$ by S5 to allow testing of the MSB-1 bit. C0 is switched to $V_{refn}$ by S9.

The change in comparator input voltage $V_{delta}$ from the $V_{bias}$ value for this ADC is given by:

$$V_{delta} = D \ast V_{ref}/2 + V_{ref}/4 - Vin + V_{refn} \quad (3)$$

Where:

$$Vin - Vref > V_{ref}/2 : D = 1; \text{ and}$$

$$Vin - V_{ref} <= V_{ref}/2 : D = 0$$

The peak magnitude of $V_{delta}$ occurs at the point in the conversion when the MSB-1 bit is being tested. FIG. 13 is a graph of this change as a function of input Voltage. The peak magnitudes of $V_{delta}$ occur at both positive and negative full scale and also at mid-scale. This peak magnitude is $V_{ref}/4$.

It should be noted that equation (3) applies only if C2 is set to $V_{refp}$ or $V_{refn}$ at the same time C1 is switched to Vrefp for testing the MSB-1 bit. If C2 is switched substantially before C1, the peak magnitude of $V_{delta}$ will remain at the previous value of $V_{ref}/2$. With $V_{bias}$ set to mid-supply, as before, the maximum input span $V_{input\_span}$ for this new ADC, to ensure that the comparator input voltage does not stray beyond the comparator supply rails, is given by the following relationship:

$$V_{input\_span} = 2 \ast (VDD - VSS) \quad (4)$$

By allowing ADC1 1201 (FIG. 12) to determine the MSB bit, the allowable input span has been doubled. This increase in input span is directly attributable to halving the peak magnitude of $V_{delta}$.

While in the case discussed above only the MSB bit was determined by an additional ADC, further increases in the input span can be achieved by using the additional ADC 1201 to determine more of the most significant bits. Also, while FIG. 12 illustrates a single-ended converter, the same benefits apply for a differential converter. The additional ADC could be a flash converter, a SAR converter, a pipeline converter or any other converter that can itself operate correctly over the input signal range.

If a SAR converter is used, attenuating capacitors can be used at the input to the comparator to attenuate the signal change at the comparator inputs. These attenuating capacitors would be placed between the comparator input(s) and some fixed bias voltage or supply. While these attenuating capacitors would result in an increase in the thermal noise floor for this ADC, by using additional range in the main SAR converter, as has been previously described, a noise-induced error can be corrected later in the conversion.

In view of the modifications suggested above, and others that will occur to the reader skilled in the art, it is not intended that the invention be limited except as may be necessary in view of the appended claims.

What is claimed is:

1. A successive approximation analog-to-digital converter that produces an output digital representation of an input signal to be converted, including a successive approximation register driving a first digital-to-analog converter, and a comparator having first and second inputs and first and second operating power supply voltages, to which comparator the output of the first digital-to-analog converter is applied, comprising:

a second digital-to-analog converter driven by an analog-to-digital converter that determines at least the most significant bit of the second digital-to-analog converter, wherein the output of the second digital-to-analog converter is summed with the output of the first digital-to-analog converter prior to being applied to the comparator.

2. The successive approximation analog-to-digital converter of claim 1, wherein the analog-to-digital converter driving the second digital-to-analog converter comprises at least one switched sampling capacitor having a first terminal switchably coupled to said analog-to-digital converter's input, and a second terminal coupled to a first terminal of a second capacitor, a second terminal of the second capacitor being switchably coupled to a bias voltage so as to attenuate any signal change on the second terminal of the switched sampling capacitor.

3. The successive approximation analog-to-digital converter of claim 2, wherein the first digital-to-analog converter has a full-scale range at least equal to a value derived by subtracting the weight of an LSB of the first digital-to-analog converter from the weight of an LSB of the second digital-to-analog converter, and adding the magnitudes of the analog-to-analog converter's most positive code transition error plus the magnitude of the analog-to-digital converter's most negative code transition error, such that potential errors introduced by analog-to-digital converter code transition errors are eliminated from the output digital representation.

4. The successive approximation analog-to-digital converter of claim 3, wherein said analog-to-digital converter's most positive or most negative code transition error is zero.

5. The successive approximation analog-to-digital converter of claim 4, wherein all code transitions are shifted in a positive direction by an amount at least equal to the magnitude of the largest negative code transition error.

6. The successive approximation analog-to-digital converter of claim 4, wherein comparator thresholds are shifted to effectively eliminate negative code transition errors.

7. The successive approximation analog-to-digital converter of claim 4, wherein the analog input to the analog-to-digital converter is offset in the negative direction by an amount at least equal to the magnitude of the largest negative code transition error, whereby negative code transistor errors are effectively eliminated.

8. The successive approximation analog-to-digital converter of claim 4, wherein the first digital output from the analog-to-digital converter is first shifted by adding a fixed offset before being applied to the first digital-to-analog converter.

9. The successive approximation analog-to-digital converter of claim 2, wherein the second terminal of the switched sampling capacitor is switched to an input of the comparator used for performing the LSB bit trials in order to determine the MSB bit, such that there is no separate coarse conversion comparator.

10. The successive approximation analog-to-digital converter of claim 2, wherein the second capacitor is a parasitic capacitor.

11. The successive approximation analog-to-digital converter of claim 2, wherein the analog-to-digital converter is implemented, at least in part, using switched capacitor techniques, and the offset is achieved by means of at least one additional capacitor and at least one additional device that functions as a switch.

12. The successive approximation analog-to-digital converter of claim 1, in which the analog-to-digital converter driving the second digital-to-analog converter performs a coarse conversion of the input signal to be converted and propagates the coarse conversion result to the second digital-to-analog converter prior to the successive approximation conversion.

13. The successive approximation analog-to-digital converter of claim 12, in which the analog-to-digital converter driving the second digital-to-analog converter incorporates, at least in part, a parallel analog-to-digital converter.

14. The successive approximation analog-to-digital converter of claim 13, wherein the parallel analog-to-digital converter comprises, at least in part, a flash converter.

15. The successive approximation analog-to-digital converter of claim 14, wherein the parallel analog-to-digital converter comprises, at least in part, a pipeline converter.

16. The successive approximation analog-to-digital converter of claim 12, wherein the first digital-to-analog converter has an associated full-scale range derived by subtracting negative full-scale value from positive full-scale value, and said full-scale range is constrained to be greater than a value derived by subtracting the weight of an LSB of the first digital-to-analog converter from the weight of an LSB of the second digital-to-analog converter.

17. The successive approximation analog-to-digital converter of claim 16, wherein the center of the full-scale range of the first digital-to-analog converter is shifted from zero in the negative direction by application of one or more fixed offsets.

18. The successive approximation analog-to-digital converter of claim 17, whereby said one or more fixed offsets are applied prior to completion of a successive approximation conversion, regardless of comparator output.

19. The successive approximation analog-to-digital converter of claim 17, wherein the total value of said one or more fixed offsets is at least as negative as the analog-to-digital converter's most negative code transition error.

20. The successive approximation analog-to-digital converter of claim 17, wherein said one or more fixed offsets are provided by a third digital-to-analog converter.

21. The successive approximation analog-to-digital converter of claim 16, wherein the output digital representation is derived from the digital input to the first digital-to-analog converter and the digital input to the second digital-to-analog converter, by providing said digital inputs to the first and second digital-to-analog converters, and providing a digital representation of the total value of all fixed offsets, as three inputs to recombination logic that provides the output digital representation.

22. The successive approximation analog-to-digital converter of claim 21, wherein the recombination logic operates on the three inputs to provide the output digital representation that corresponds to the sum of the predetermined bit weights in the first and second digital-to-analog converters, plus the total weight of said one or more fixed offsets.

23. The successive approximation analog-to-digital converter of claim 16, wherein the full-scale range of the first digital-to-analog converter is extended from $2^n-1$ by at least an amount equal to the sum of the magnitudes of the positive and negative code transition errors of the analog-to-digital converter driving the second digital-to-analog converter.

24. The successive approximation analog-to-digital converter of claim 16, wherein the first digital-to-analog converter is binary weighted.

25. The successive approximation analog-to-digital converter of claim 16, wherein the first digital-to-analog converter is non-binary weighted.

26. The successive approximation analog-to-digital converter of claim 16, wherein the MSB of the first digital-to-analog converter has a weight that is at least equal to the weight of the LSB of the second digital-to-analog converter.

27. The successive approximation analog-to-digital converter of claim 1, wherein the second digital-to-analog converter is a capacitor array type of converter and further wherein switching of the capacitors corresponding to bits determined by the analog-to-digital converter driving the second digital-to-analog converter and a next DAC bit being selected for testing is sequenced such that comparator input signal swing is minimized.

28. The successive approximation analog-to-digital converter of claim 27, wherein switching of capacitors occurs at substantially the same time.

29. The successive approximation analog-to-digital converter of claim 1, wherein the comparator includes parasitic diodes at its inputs and the summation of the output of the second digital-to-analog converter with the output of the first digital-to-analog converter maintains the voltage range at the comparator inputs to a range wherein the parasitic diodes are in an off state.

30. A successive approximation analog-to-digital converter that produces an output digital representation of an input signal to be converted, the analog-to-digital converter comprising:
  a successive approximation register driving a first digital-to-analog converter;
  a comparator to which both the output of the first digital-to-analog converter and the input signal are applied; and
  a second digital-to-analog converter driven by an analog-to-digital converter that performs a coarse conversion of the input signal to be converted, and propagates the coarse conversion result to the second digital-to-analog converter prior to the successive approximation conversion;
  such that the comparator input voltage is reduced to a range no larger than the difference between the first and second operating power supply voltages;
  wherein the output of the second digital-to-analog converter is summed with the output of the first digital-to-analog converter prior to being applied to the comparator.

31. The successive approximation analog-to-digital converter of claim 30, wherein the first digital-to-analog converter has an associated full-scale range derived by subtracting negative full-scale value from positive full-scale value, and said full-scale range is constrained to be greater than a value derived by subtracting the weight of an LSB of the first digital-to-analog converter from the weight of an LSB of the second digital-to-analog converter.

32. The successive approximation analog-to-digital converter of claim 31, wherein the full-scale range of the first digital-to-analog converter is extended relative to $2^n-1$ in the direction of the negative full-scale value by application of one or more fixed offsets.

33. The successive approximation analog-to-digital converter of claim 32, whereby said one or more fixed offsets are applied prior to completion of a successive approximation conversion, regardless of comparator output.

34. The successive approximation analog-to-digital converter of claim 32, wherein the total value of said one or more fixed offsets is at least as negative as the analog-to-digital converter's most negative code transition error.

35. The successive approximation analog-to-digital converter of claim 32, wherein said one or more fixed offsets are provided by a third digital-to-analog converter.

36. The successive approximation analog-to-digital converter of claim 31, wherein the output digital representation is derived from the digital input to the first digital-to-analog converter and the digital input to the second digital-to-analog converter, by providing said digital inputs to the first and second digital-to-analog converters, and providing a digital representation of the total value of all fixed offsets, as three inputs to recombination logic that provides the output digital representation.

37. The successive approximation analog-to-digital converter of claim 36, wherein the recombination logic operates on the three inputs to provide the output digital representation that corresponds to the sum of the predetermined bit weights in the first and second digital-to-analog converters, plus the total weight of said one or more fixed offsets.

38. The successive approximation analog-to-digital converter of claim 31, wherein the full-scale range of the first digital-to-analog converter is extended relative to $2^n-1$ by at least an amount equal to the sum of the magnitudes of the positive and negative code transition errors of the analog-to-digital converter driving the second digital-to-analog converter.

39. The successive approximation analog-to-digital converter of claim 31, wherein the first digital-to-analog converter is binary weighted.

40. The successive approximation analog-to-digital converter of claim 31, wherein the first digital-to-analog converter is non-binary weighted.

41. The successive approximation analog-to-digital converter of claim 31, wherein the MSB of the first digital-to-analog converter has a weight that is at least equal to the weight of the LSB of the second digital-to-analog converter.

42. The successive approximation analog-to-digital converter of claim 30, wherein the switching of capacitors corresponding to bits determined by the analog-to-digital converter driving the second digital-to-analog converter and a next DAC bit being selected for testing is sequenced such that comparator input signal swing is minimized.

43. The successive approximation analog-to-digital converter of claim 30, wherein switching of capacitors occurs at substantially the same time.

44. The successive approximation analog-to-digital converter of claim 30, wherein the analog-to-digital converter driving the second digital-to-analog converter comprises at least one switched sampling capacitor having a first terminal switchably coupled to said analog-to-digital converter's input, and a second terminal coupled to a first terminal of a second capacitor, a second terminal of the second capacitor being switchably coupled to a bias voltage so as to attenuate any signal change on the second terminal of the switched sampling capacitor.

45. The successive approximation analog-to-digital converter of claim 30, in which the analog-to-digital converter driving the second digital-to-analog converter incorporates, at least in part, a parallel analog-to-digital converter.

* * * * *